United States Patent [19]

Shimada et al.

[11] Patent Number: 5,281,554
[45] Date of Patent: Jan. 25, 1994

[54] METHOD FOR PRODUCING A SEMICONDUCTOR DEVICE HAVING A TANTALUM THIN FILM

[75] Inventors: Yasunori Shimada, Nara; Hiroshi Morimoto, Kitakatsuragi, both of Japan

[73] Assignee: Sharp Kabushiki Kaisha, Osaka, Japan

[21] Appl. No.: 49,595

[22] Filed: Apr. 20, 1993

Related U.S. Application Data

[63] Continuation of Ser. No. 829,476, Feb. 3, 1992, abandoned.

[30] Foreign Application Priority Data

Feb. 8, 1991 [JP] Japan ................................. 3-018007
Jan. 8, 1992 [JP] Japan ................................. 4-001741

[51] Int. Cl.⁵ .......................................... H01L 21/283
[52] U.S. Cl. ........................................ 437/180; 437/187; 437/245; 204/192.17; 148/DIG. 158
[58] Field of Search ............... 437/180, 187, 192, 243, 437/245; 148/DIG. 158; 204/192.13, 192.15, 192.17, 192.22, 192.23, 192.25, 298.12

[56] References Cited

U.S. PATENT DOCUMENTS

| | | | |
|---|---|---|---|
| 3,558,461 | 1/1971 | Parisi | 204/192.21 |
| 3,714,013 | 1/1973 | Rairden | 204/192.21 |
| 3,763,026 | 10/1973 | Cordes | 204/192.21 |
| 3,775,278 | 11/1973 | Hensler et al. | 204/192.21 |
| 3,869,367 | 3/1975 | Sato et al. | 204/192.25 |
| 3,878,079 | 4/1975 | Schauer | 204/192.25 |
| 4,042,479 | 8/1977 | Yamazaki et al. | 204/192.21 |
| 4,988,422 | 1/1991 | Wirz | 204/192.15 |
| 5,068,022 | 11/1991 | Carcia | 204/192.15 |

OTHER PUBLICATIONS

Cuomo, J. J., et al., "Incorporation of rare gases ...", *J. Vac. Sci. Technol.*, vol. 14, No. 1, Jan./Feb. 1977, pp. 152–157.

Gerstenberg, D., "Properties of Anodic Films ...", *J. Electrochem. Soc.*, vol. 113, No. 6, Jun., 1966, pp. 542–547.

M. Nakamura et al., *Japanese Journal of Applied Physics*, vol. 9, No. 5, May 1970, pp. 557–571, "Phase Forming Processes in Tantalum Films Through Sputtering".

*Primary Examiner*—T. N. Quach
*Attorney, Agent, or Firm*—Nixon & Vanderhye

[57] ABSTRACT

A method for producing a semiconductor device including forming an electrode or an electrode wiring by forming a tantalum thin film by sputtering is provided. In this method, a krypton gas in which nitrogen is mixed as a reactive gas is used as a sputtering gas, and a product of the pressure of the sputtering gas and a target-substrate distance is set in the range of 0.01 m.Pa to 0.08 m.Pa.

6 Claims, 4 Drawing Sheets

METHOD FOR PRODUCING A SEMICONDUCTOR DEVICE HAVING A TANTALUM THIN FILM

This is a continuation of application Ser. No. 07/829,476, filed Feb. 3, 1992, now abandoned.

BACKGROUND OF THE INVENTION

1. Field of the Invention

The present invention relates to a sputtering method for forming a tantalum thin film electrode or electrode wiring for a semiconductor device.

2. Description of the Prior Art

In the past, in a liquid crystal display device, a display pattern is formed on a screen by selecting display picture elements arranged in a matrix. An active matrix driving method can be used for selecting display picture elements. According to this method, independent picture element electrodes are arranged so as to correspond to the respective picture elements, and switching elements are connected to the respective picture element electrodes, thereby performing a display. A liquid crystal display device using this method enables a display with a high contrast and can be put into practical use for TV, etc.

Examples of the switching elements for selectively driving picture element electrodes include TFT (thin film transistor) elements, MIM (metal-insulator -metal) elements, MOS (metal oxide semiconductor) transistor elements, diodes, and varistors. A voltage signal applied between the picture element electrodes and the electrodes facing thereto is switched (ON or OFF), whereby an optical modulation of liquid crystal existing therebetween is visualized as a display pattern.

In order to provide the liquid crystal display device of an active matrix driving system mentioned above with high precision, it is necessary to make the picture element electrodes as small as possible. In order to make the screen larger, for example, in the case where the switching elements are TFTs, it is necessary to make gate electrode wirings and source electrode wirings thinner and longer. Moreover, in the case where the TFT has inverted staggered structure, since the gate electrode wiring is formed mn an initial stage of the process for forming the TFT, it is required that the wiring be thin and have a sufficiently low resistance. Also, it is required that a material having a strong corrosion resistance be used for the wiring so as to withstand the subsequent process. In the past, as a material which satisfies these requirements, a metal material such as tantalum (Ta), chromium (Cr), or titanium (Ti) has been used. In particular, tantalum is mainly used, since tantalum has a strong acid resistance and a fine selfoxidized film can be obtained by an anodic oxidation method when tantalum is used as the material.

When a metallic thin film made of tantalum is formed by sputtering, argon is used as a sputtering gas in the conventional method, so that a tantalum structure becomes β-Ta and its specific resistance is in the range of 170 $\mu\Omega$.cm to 200 $\mu\Omega$.cm. As a conventional well-known method for decreasing this specific resistance, there is a method for doping argon with nitrogen. It is confirmed that according to this method, the specific resistance can be minimized in the range of 70 $\mu\Omega$.cm to 100 $\mu\Omega$.cm.

However, the specific resistance at this level is not Sufficient. When the gate electrode wiring is made longer and thinner in a liquid crystal display device using the tantalum film as the electrode wiring for the purpose of realizing a large screen and high precision, the electrical resistance of the gate electrode wiring rapidly rises and the time constant of the gate electrode wiring increases. When the time constant of the gate electrode wiring increases, a rising of an ON signal at the TPT disposed at the and of the gate electrode wiring becomes slow. Also, a falling of the ON signal from ON to OFF becomes slow. Because of this, the picture element at the end of the gate electrode wiring is not sufficiently charged during the writing of its signal, and the picture element takes in signals of the other picture elements. As a result, the liquid crystal display device cannot perform a normal display.

Accordingly, in order for the liquid crystal display device to perform a normal display, it is necessary to decrease the electrical resistance of the gate electrode wiring. As a means for this, a gate electrode wiring with a two-layered or three-layered structure using a material which can be readily formed into a thin film having a low specific resistance such as aluminum and molybdenum is considered.

However, in this kind of gate electrode wiring with a multi-layered structure, the process for manufacturing becomes complicated because of the necessity of an increase in the processes for forming films and the photolithography processes. In addition, the above-mentioned materials have a lower acid resistance compared with tantalum, so that the gate electrode wiring is likely to be damaged in the process after forming the TPT and a disconnection occurs, resulting in decreased reliability and yield.

In Japanese Laid-Open Patent Publication No. 62-205656, a method for decreasing the specific resistance of a thin film which is a material for the gate electrode wiring by mixing molybdenum with tantalum is proposed. According to this method, the specific resistance of a thin film becomes 40 $\mu\Omega$.cm.

However, when an alloy is formed by mixing molybdenum with tantalum, molybdenum contained in the film is eluted in the process for anodizing the gate electrode wiring, and an oxide film whose molecular orientation is denser than that of an oxide film obtained by anodizing tantalum cannot be obtained.

SUMMARY OF THE INVENTION

In the method for producing a semiconductor device for forming an electrode or an electrode wiring by forming a tantalum thin film by sputtering of this invention, which overcomes the above-discussed and numerous other disadvantages and deficiencies of the prior art, a krypton gas in which nitrogen is mixed as a reactive gas is used as a sputtering gas, and a product of the pressure of the sputtering gas and a target-substrate distance is set in the range of 0.01 m.Pa to 0.08 m.Pa.

In a preferred embodiment, an input electrical power density applied to the target is set at 3.0 W/cm$^2$ or more.

In a preferred embodiment, the pressure of the sputtering gas is sat in the range of $2.0 \times 10^{-1}$ Pa to $7.0 \times 10^{-1}$ Pa when the targetsubstrate distance is 80 mm.

In a preferred embodiment, the pressure of the sputtering gas is set at $4.0 \times 10^{-1}$ Pa.

In a preferred embodiment, the pressure of the sputtering gas is set in the rang#of $0.7 \times 10^{-1}$ Pa to $4.0 \times 10^{-1}$ Pa when the target-substrate distance is in the range of 150 mm to 200 mm.

In a preferred embodiment, the pressure of the sputtering gas is set in the range of $2.0 \times 10^{-1}$ Pa to $7.0 \times 10^{-1}$ Pa when the target-substrate distance is 65 mm.

As is apparent from graphs shown in FIGS. 1, 3, and 4 when the sputtering gas in which nitrogen is mixed as a reactive gas is used under the conditions described above, a tantalum film having a remarkably lower specific resistance compared with the prior art can be formed.

Thus, the invention described herein makes possible the objective of providing a method for producing a semiconductor device in which a thin film of tantalum having a sufficiently low specific resistance and a high acid resistance can be formed in a simple process, whereby a semiconductor device whose reliability and yield are improved can be produced at a low cost.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Hereinafter, the present invention will be described by way of illustrating examples.

EXAMPLE 1

In the present example, as a sputtering device, a well-known magnetron sputtering device of a DC plane parallel plate type was used. A substrate made of the following material was set in a chamber of the sputtering device, and the sputtering was performed under the conditions described below, thereby forming a tantalum thin film on the surface of the substrate as an electrode or an electrode wiring.

As the substrate, a substrate which was subjected to a predetermined treatment for forming a TFT on the surface thereof, such as a glass substrate made of quartz, silica having a concentration of 96% to 98% or borosilicate; a $BaO-Al_2O_3-B_2O_3-SiO_2$ glass substrate manufactured by Corning Incorporated. 7059 (Trade No.); a Si wafer substrate; or a substrate obtained by coating an oxide insulation film of $Ta_2O_5$ or $SiO_2$ on the respective surfaces of the above-mantioned substrates was used.

After the above-mentioned substrate was set in the chamber of the sputtering device, the chamber was suctioned to be evacuated so that the internal pressure of the chamber became $1.0 \times 10^{-4}$ Pa or less. Then, a krypton gas in which nitrogen was mixed was introduced into the chamber which was depressurized as described above, and the internal pressure was kept at a constant value in the range of $2.0 \times 10^{-1}$ Pa to $7.0 \times 10^{-1}$ Pa. Moreover, the target-substrate distance was maintained at 80 mm. At this time, the product of the gas pressure and the target-substrate distance became 0.016 m.Pa to 0.056 m.Pa.

Under the above-mentioned conditions, the pre-sputtering was performed-at an electrical power (an input electrical power density applied to the target of the sputtering device) of 1.0 W/cm² or more, and then the input electrical power was set to a value of 3.0 W/cm² or more. The sputtering was performed for the purpose of forming a tantalum thin film by using, as a sputtering gas, the krypton gas in which nitrogen was mixed as a reactive gas. When a tantalum thin film having a desired thickness was formed by this sputtering, the electrical power supply was stopped. At the same time, the introduction of the sputtering gas into the chamber was stopped. The substrate was cooled for a predetermined period of time, after which it was taken out of the chamber. Thus, the substrate on which the tantalum thin film was formed was obtained. After that, the substrate was subjected to the treatments for forming a TFT, if required, whereby a semiconductor device (e.g., a liquid crystal display device) using a tantalum thin film as an electrode or an electrode wiring was produced.

Figure 1:
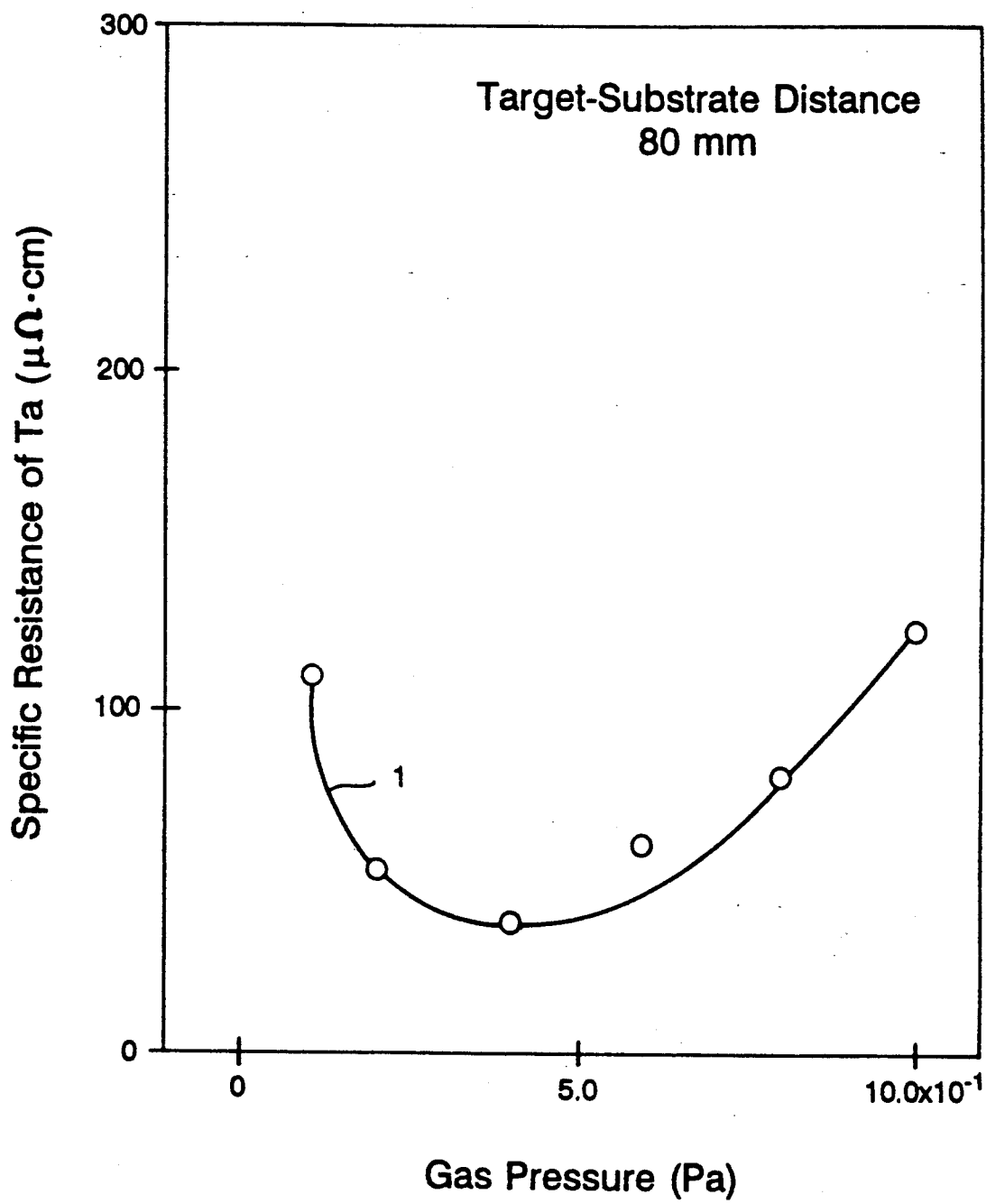
FIG. 1 is a graph showing a relationship between the specific resistance of a tantalum thin film and the gas pressure of a sputtering gas in the case when the target-substrate distance is 80 mm.

FIG. 1 is a graph showing the relationship between the specific resistance ($\mu\Omega$.cm) of the tantalum thin film formed as described above and the pressure of the sputtering gas (Pa), with the proviso that the amount of nitrogen doped was 7.4%.

As is apparent from a characteristic curve 1 in the graph, when the sputtering is performed by setting the gas pressure in the range of 0.2 Pa to 0.7 Pa, the specific resistance of the tantalum thin film becomes 60 $\mu\Omega$.cm or less, and the specific resistance can be reduced compared with the prior art using argon as a sputtering gas in which the specific resistance is in the range of 70 $\mu\Omega$.cm to 100 $\mu\Omega$.cm. In particular, a tantalum thin film having a sufficiently low specific resistance of 40 $\mu$.cm or less is realized in the vicinity of 0.4 Pa, so that the sputtering in the vicinity of this value is preferred.

Figure 2:
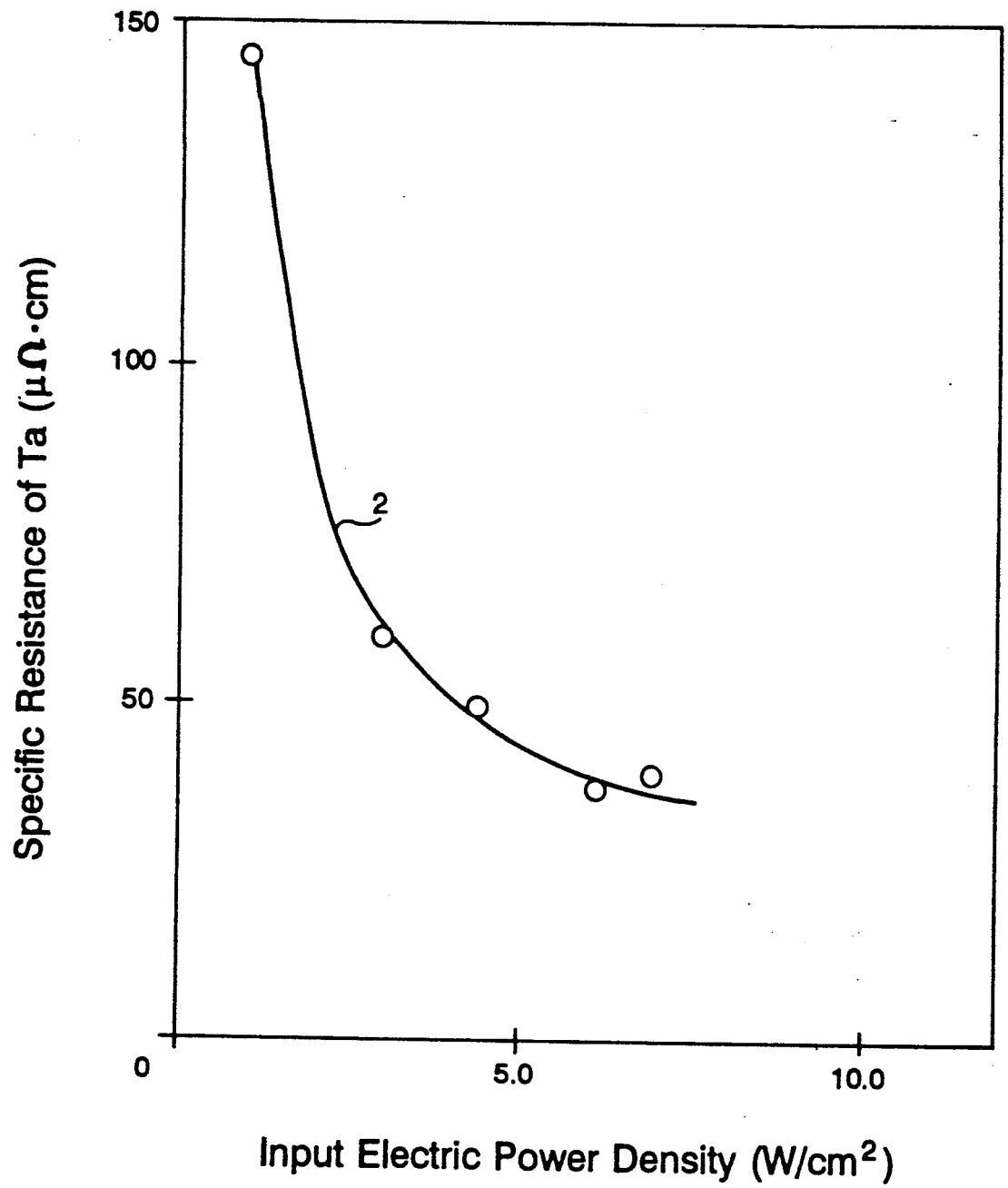
FIG. 2 is a graph showing a relationship between the specific resistance of the tantalum thin film and the Input electric power density with respect to the target.

FIG. 2 is a graph showing the relationship between the specific resistance of the tantalum thin film and the input electrical power density (W/cm²) with respect to the target, with the proviso that the amount of nitrogen doped is 7.4%.

As is apparent from a characteristic curve 2 in the graph, the specific resistance of the tantalum thin film is decreased with the increase in the input electrical power density. It is understood that the specific resistance of the tantalum thin film can be made lower than the range of 70 $\mu\Omega$.cm to 100 $\mu\Omega$.cm of the above-mentioned prior art at 3.0 W/cm² or more. Accordingly, the sputtering is preferably performed at an input electrical power density of 3.0 W/cm² or more.

EXAMPLE 2

The substrate described in Example 1 was set in the chamber of the sputtering device, and then the chamber was suctioned to be evacuated so that the internal pressure of the chamber became $1.0 \times 10^{-4}$ Pa or less. Then, a krypton gas in which nitrogen was mixed was introduced into the chamber which was depressurized as described above, and the internal pressure was kept at a constant value in the range of $0.7 \times 10^{-1}$ Pa to $4.0 \times 10^{-1}$ Pa. Moreover, the targetsubstrate distance was maintained in the range of 50 mm to 200 mm. At this time, the product of the gas pressure and the target-substrate distance became 0.0105 m.Pa to 0.08 m.Pa.

Under the above-mentioned conditions, the presputtering was performed at an electrical power (an input electrical power density applied to the target of the sputtering device) of 1.0 W/cm² or more, and then the input electrical power was set to a value of 3.0 W/CM² or more. The sputtering was performed for the purpose of forming a tantalum thin film by using, as a sputtering gas, krypton gas in which nitrogen was mixed as a reactive gas. When a tantalum thin film having a desired thickness was formed by this sputtering, the supply of the electrical power was stopped. At the same time, the introduction of the sputtering gas into the chamber was stopped. The substrate was cooled for a predetermined period of time, after which it was taken out of the chamber. Thus, the substrate on which the tantalum thin film was formed was obtained. After that, the substrate was subjected to the treatments for forming a TFT, if required, whereby a semiconductor device (e.g., a liquid crystal display device) using a tantalum thin film as an electrode or an electrode wiring was produced.

Figure 3:
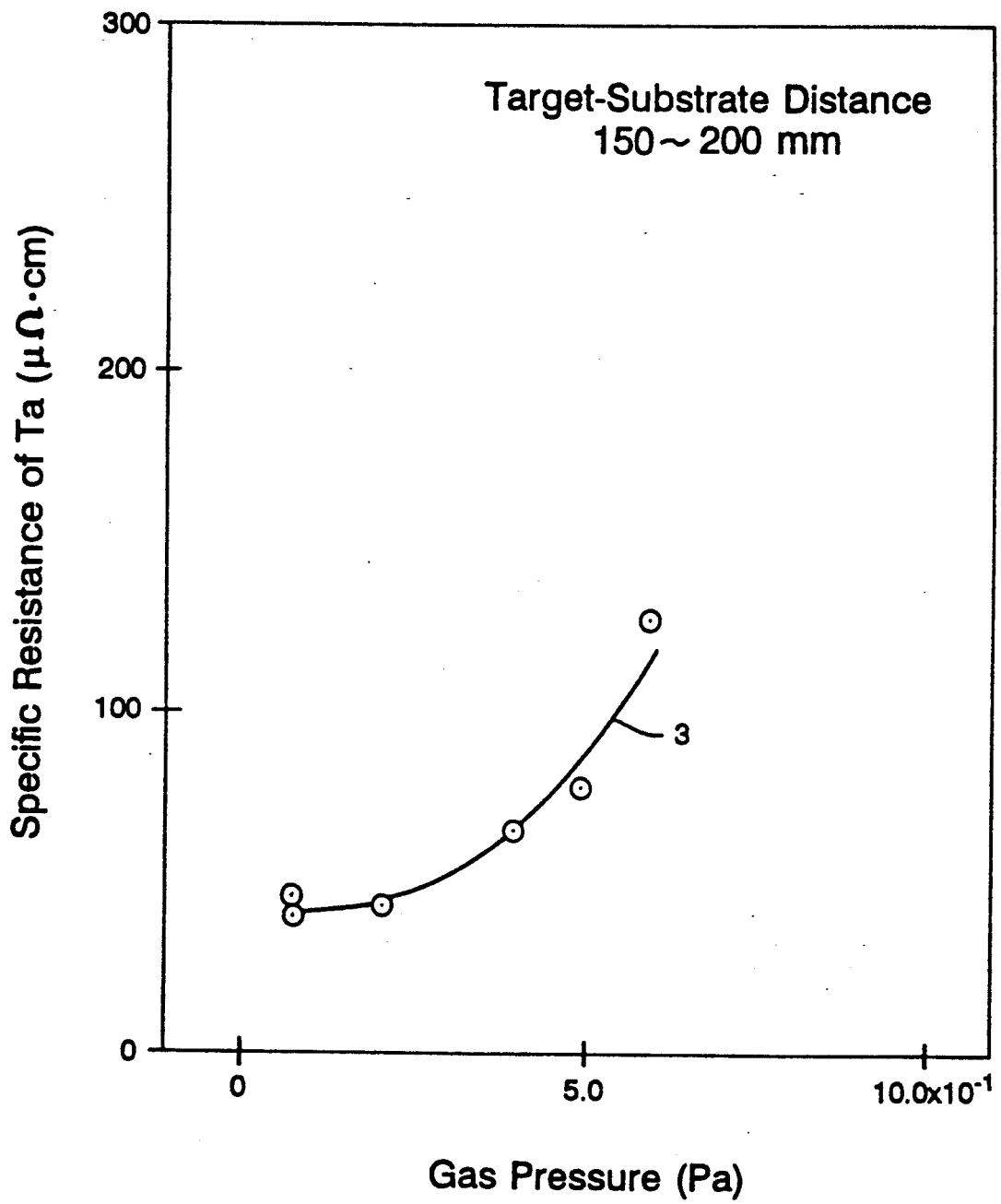
FIG. 3 is a graph showing a relationship between the specific resistance of a tantalum thin film and the gas pressure of a sputtering gas in the case when the target-substrate distance is 150 mm to 200 mm.

FIG. 3 is a graph showing the relationship between the specific resistance ($\mu\Omega.cm$) of the tantalum thin film formed as described above and the pressure of the sputtering gas (Pa), with the proviso that the amount of nitrogen doped is 6.8%.

As is apparent from a characteristic curve 3 in the graph, when the sputtering is performed by setting the gas pressure in the range of $0.7 \times 10^{-1}$ Pa to $4.0 \times 10^{-1}$ Pa, the specific resistance of the tantalum thin film becomes 60 $\mu\Omega.cm$ or less.

EXAMPLE 3

The substrate described in Example 1 was set in the chamber of the sputtering device, the chamber was suctioned to be evacuated so that the internal pressure of the chamber became $1.0 \times 10^{-1}$ Pa or less. Then, a krypton gas in which nitrogen was mixed was introduced into the chamber which was depressurized as described above, and the internal pressure was kept at a constant value in the range of $2.0 \times 10^{-1}$ Pa to $7.0 \times 10^{-1}$ Pa. Moreover, the target-substrate distance was maintained at 65 mm. At this time, the product of the gas pressure and the target-substrate distance became 0.013 m.Pa to 0.046 m.Pa.

Under the above-mentioned conditions, the presputtering was performed at an electrical power (an input electrical power density applied to the target of the sputtering device) of 1.0 W/cm² or more, and then the input electrical power was set to a value of 3.0 W/cm² or more. The sputtering was performed for the purpose of forming a tantalum thin film by using, as a sputtering gas, the krypton gas in which nitrogen was mixed as a reactive gas. When a tantalum thin film having a desired thickness was formed by this sputtering, the electrical power supply was stopped. At the same time, the introduction of the sputtering gas into the chamber was stopped and cooled for a predetermined period of time, after which the substrate was taken out of the chamber. Thus, the substrate on which the tantalum thin film was formed was obtained. After that, the substrate was subjected to the treatments for forming a TFT, if required, whereby a semiconductor device (e.g., a liquid crystal display device) using a tantalum thin film as an electrode or an electrode wiring was produced.

Figure 4:
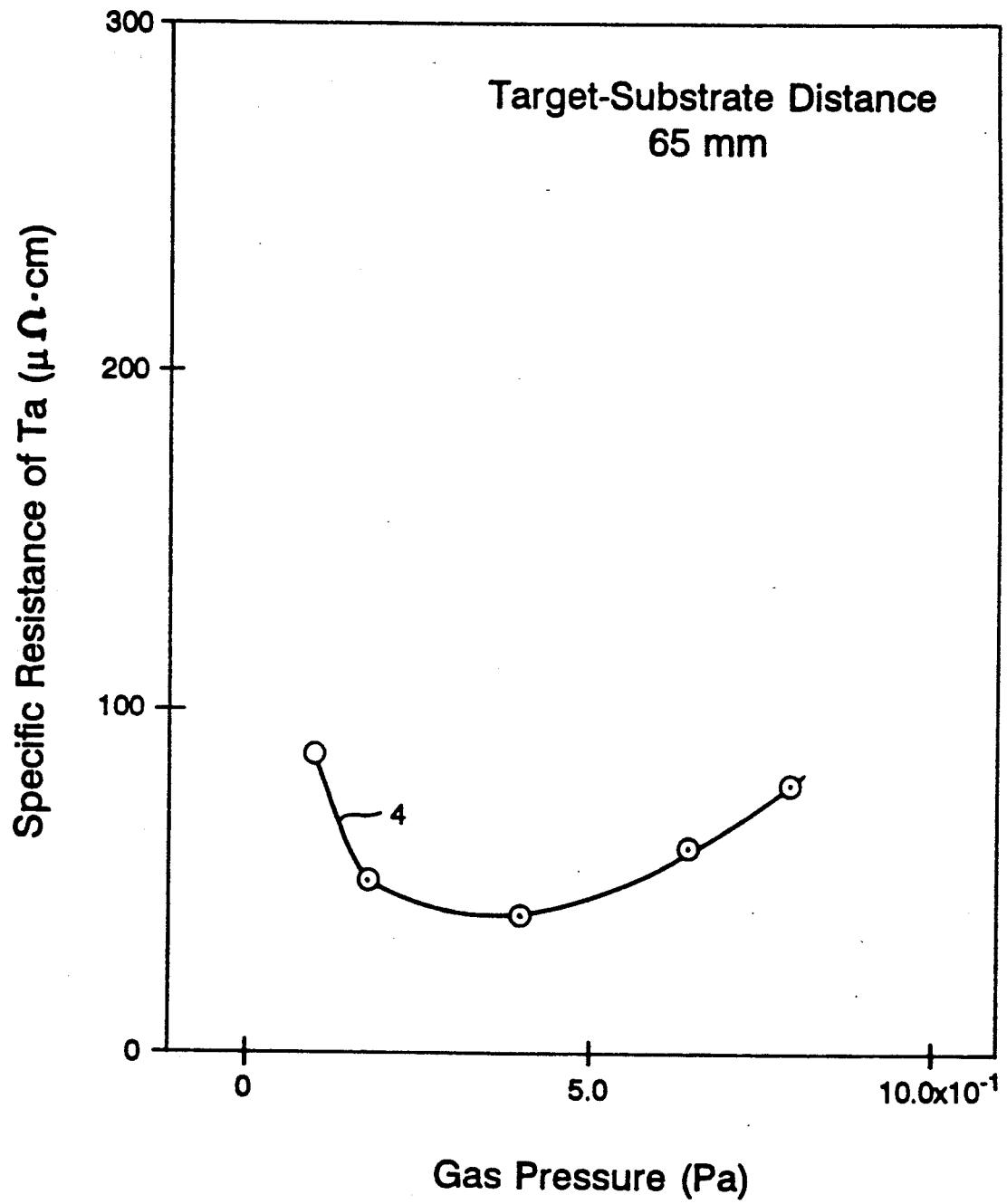
FIG. 4 is a graph showing a relationship between the specific resistance of the tantalum thin film and the gas pressure of the sputtering gas in the case when the target-substrate distance is 65 mm.

FIG. 4 is a graph showing the relationship between the specific resistance ($\mu\Omega.cm$) of the tantalum thin film formed as described above and the pressure of the sputtering gas (Pa), with the proviso that the amount of nitrogen doped is 3.8%.

As is apparent from a characteristic curve 4 in the graph, when the sputtering is performed by setting the gas pressure in the range of $2.0 \times 10^{-1}$ Pa to $7.0 \times 10^{-1}$ Pa, the specific resistance of the tantalum thin film becomes 60 $\mu\Omega.cm$ or less.

As described above, according to the present invention, a tantalum thin film having a specific resistance which is about a half of that of the prior art can be formed. Accordingly, an electrical resistance of a gate electrode wiring and the like can be made lower without using a multi-layered structure, so that when this kind of the tantalum thin film is applied to a liquid crystal display device, the liquid crystal display device with high precision and a large screen can be readily obtained. Moreover, there is an advantage that a high yield can be maintained without increasing the number of processes for forming films or photolithography processes. In addition, the increase in the production cost caused by the increase in the processes can be prevented. Furthermore, the tantalum thin film has a high acid resistance, so that the reliability can be improved without generating a disconnection during the subsequent steps. An oxide film having a dense molecular orientation can be obtained by the anodic oxidation method, so that the leak defects can be avoided in a similar way as in the prior art.

It is understood that various other modifications will be apparent to and can be readily made by those skilled in the art without departing from the scope and spirit of this invention. Accordingly, it is not intended that the scope of the claims appended hereto be limited to description as set forth herein, but rather that the claims be construed as encompassing all the features of patentable novelty that reside In the present invention, including all features that would be treated as equivalents thereof by those skilled in the art to which this invention pertains.

What is claimed is:

1. A method for producing a tantalum thin film electrode or electrode wiring for a semiconductor device, the method comprising:
    using a krypton gas in which nitrogen is mixed as a reactive gas as a sputtering gas, and
    conducting the sputtering at a sputtering gas pressure and with a target separated from the substrate such that a product of the pressure of the sputtering gas and a target-substrate distance is in a range of 0.01 m.Pa to 0.08 m.Pa.

2. The method of claim 1, further comprising applying to the target an input electrical power density of at least 3.0 W/cm².

3. The method of claim 1, wherein the conducting step includes setting the pressure of the sputtering gas in a range of $2.0 \times 10^{-1}$ Pa to $7.0 \times 10^{-1}$ Pa when the target-substrate distance is 80 mm.

4. The method of claim 3, wherein the conducting step includes setting the pressure of the sputtering gas at $4.0 \times 10^{-1}$ Pa.

5. The method of claim 1, wherein the conducting step includes setting the pressure of the sputtering gas in a range of $0.7 \times 10^{-1}$ Pa to $4.0 \times 10^{-1}$ Pa when the target-substrate distance is in a range of 150 mm to 200 mm.

6. The method of claim 1, wherein the conducting step includes setting the pressure of the sputtering gas in a range of $2.0 \times 10^{-1}$ Pa to $7.0 \times 10^{-1}$ Pa when the target-substrate distance is 65 mm.

* * * * *